(12) United States Patent
Kuhlman et al.

(10) Patent No.: US 7,245,024 B2
(45) Date of Patent: Jul. 17, 2007

(54) ELECTRONIC ASSEMBLY WITH REDUCED LEAKAGE CURRENT

(75) Inventors: Frederick F. Kuhlman, Kokomo, IN (US); Brentt C. Duff, Carmel, IN (US); Michael J. Pepples, Noblesville, IN (US); Raymond B. Anton, Carmel, IN (US); Daniel R. Harshbarger, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 30 days.

(21) Appl. No.: 11/040,726

(22) Filed: Jan. 21, 2005

(65) Prior Publication Data

US 2006/0163721 A1 Jul. 27, 2006

(51) Int. Cl.
*H01L 23/52* (2006.01)
*H01L 23/48* (2006.01)
*H01L 29/40* (2006.01)
*H01L 23/34* (2006.01)

(52) U.S. Cl. ............... 257/779; 257/783; 257/690; 257/724; 257/E23.023

(58) Field of Classification Search ............... 257/779, 257/783, 690, 724
See application file for complete search history.

(56) References Cited

U.S. PATENT DOCUMENTS

| 5,001,829 | A | * | 3/1991 | Schelhorn | ............ 29/840 |
| 5,684,677 | A | * | 11/1997 | Uchida et al. | ............ 361/770 |
| 6,049,466 | A | * | 4/2000 | Jairazbhoy | ............ 361/774 |
| 2002/0053589 | A1 | * | 5/2002 | Owen et al. | ............ 228/104 |
| 2003/0006503 | A1 | * | 1/2003 | Yoneda et al. | ............ 257/730 |
| 2005/0061107 | A1 | * | 3/2005 | Hampden-Smith et al. | ... 75/332 |

* cited by examiner

*Primary Examiner*—Nitin Parekh
(74) *Attorney, Agent, or Firm*—Jimmy L. Funke

(57) ABSTRACT

An electronic assembly includes a substrate and at least one surface mounted electronic component. The substrate includes a first side and a second side opposite the first side. The first side of the substrate includes a plurality of conductive traces formed thereon. The plurality of conductive traces includes a first conductive trace and a second conductive trace. The electronic component is electrically coupled between the first and second conductive traces. A component body of the electronic component is subject to interaction with a flux, which is utilized during electrical coupling of the electronic component to the first and second conductive traces, to form a current leakage path. The substrate is configured to prevent the formation of the current leakage path.

22 Claims, 2 Drawing Sheets

ELECTRONIC ASSEMBLY WITH REDUCED LEAKAGE CURRENT

TECHNICAL FIELD

The present invention is generally directed to an electronic assembly and, more specifically, to an electronic assembly with reduced leakage current.

BACKGROUND OF THE INVENTION

Various electronic assemblies may be subject to increased leakage current when a flux residue, utilized in a solder reflow process to attach electronic components to conductive traces formed on a substrate, remains present on the substrate of the electronic assemblies. For example, various surface mounted electronic components, e.g., varistors, are prone to relatively high leakage currents that result from an interaction between flux residues and a component body of the components. In order to reduce potential leakage currents, various manufacturers have utilized surface mount component bodies that include an outer glass passivation layer. In such components, the outer glass passivation layer prevents interaction between the component body and the flux that is utilized during attachment of the component to conductive traces formed on the substrate. Unfortunately, components that include an outer glass passivation layer tend to be more expensive than components that do not include an outer glass passivation layer and, as such, increase the cost of an associated electronic assembly.

What is needed is a technique for reducing leakage currents associated with surface mount components utilized in electronic assemblies.

SUMMARY OF THE INVENTION

One embodiment of the present invention is directed to an electronic assembly that includes a substrate and at least one surface mounted electronic component. The substrate includes a first side and a second side opposite the first side. The first side of the substrate includes a plurality of conductive traces formed thereon. The plurality of conductive traces include a first conductive trace and a second conductive trace. The electronic component is electrically coupled between the first and second conductive traces. A component body of the electronic component is subject to interaction with a flux that is utilized during electrical coupling of the electronic component to the first and second conductive traces, to form a current leakage path. The substrate is configured to prevent the formation of the current leakage path.

According to another aspect of the present invention, a ground plane located on the first side of the substrate is configured to be substantially absent under the component body of the electronic component in order to increase the distance between the substrate and the component body and reduce the actual leakage current associated with the electronic component. According to another embodiment of the present invention, the electronic component is a varistor.

According to a different aspect of the present invention, the component body includes an oxide that is subject to migration into the flux, when the flux is in contact with the component body. When the flux is in contact with the component body, the actual leakage current is then at least partially attributable to the migration of the oxide into the flux. According to a different embodiment of the present invention, the oxide is a zinc oxide. According to another aspect of the present invention, the component body of the electronic component does not include an outer glass passivation layer. According to still a different embodiment of the present invention, the substrate is a printed circuit board (PCB).

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

As is discussed above, various electronic components, e.g., varistors, are prone to leakage currents that are caused by the interaction between flux residues and a component body of the component. In a typical situation, a continuous bridge of flux, from a first electrical contact of the component to a second electrical contact of the component, is required to be in contact with the component body in order for a leakage current to flow. As is discussed above, various component suppliers have offered higher cost components that add an outer glass passivation layer to the component. In general, the outer glass passivation layer prevents the flux residue from interacting with the component body.

According to one aspect of the present invention, a copper ground plane that would typically reside on the substrate beneath the component body is substantially eliminated. In a typical situation, while a flux bridge may still occur, by eliminating the copper layer the flux bridge is prevented from contacting the body of the component and, thus, a potential leakage current is reduced.

According to another aspect of the present invention, a material is applied to the substrate prior to component placement to block flux from flowing between the electrodes of the component. This, in essence, prevents the formation of a continuous flux bridge. Various materials may be utilized to provide the flux dam, such as a surface mount technology (SMT) adhesive or a printed circuit board (PCB) legend ink. As stated above, the flux dam inhibits formation of a flux bridge and effectively stops leakage currents. It should be appreciated that the present invention is generally applicable to any electronic assembly that utilizes varistors that are sensitive to leakage current and, more broadly, applies to any surface mount technology component, whose component body may interact with a flux residue to create a flux bridge and conduct leakage current. It should be appreciated that the use of a flux dam can be applied to various products without requiring a circuit change. Further, the elimination of a copper ground plane beneath the component body can be applied to various products without a component change.

Additionally, either technique, i.e., the flux dam technique or the copper elimination technique, can be utilized with existing or new products, using low-cost non-passivated components. Moreover, both techniques can also be utilized to potentially reduce leakage currents for passivated components. More broadly, a substrate of the electronic assembly is configured to prevent flux residue from contacting a component body and/or multiple contacts of an electronic component to reduce an actual leakage current associated with the component.

Figure 1:
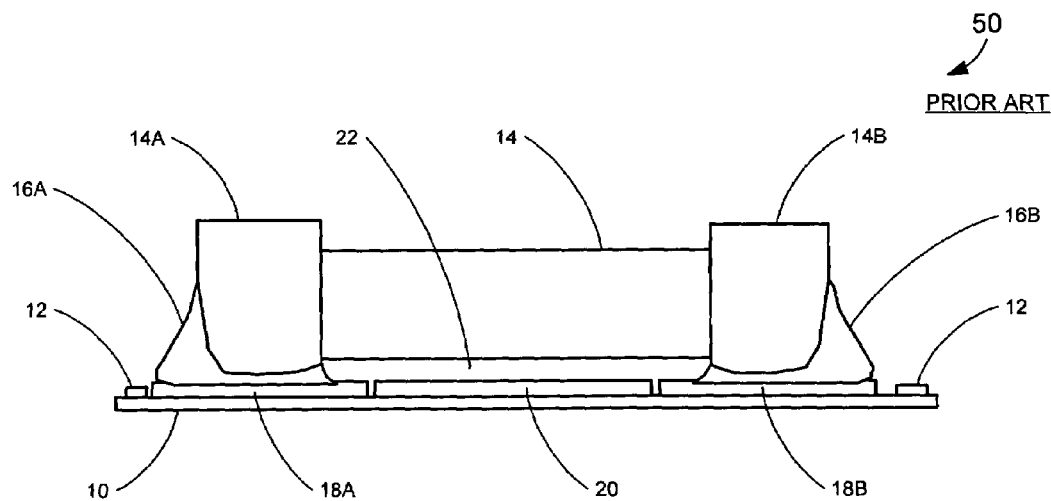
FIG. 1 is a cross-sectional view of a relevant portion of an exemplary prior art electronic assembly.

With reference to FIG. 1, a relevant portion of an exemplary electronic assembly 50 is depicted in cross-section. As is shown in FIG. 1, a substrate 10 includes electrical traces 18A and 18B formed on a first surface of the substrate 10 and a ground plane 20 formed on the first surface of the substrate 10. During a solder reflow process, ends 14A and 14B of a surface mount technology (SMT) electronic component 14 are attached with solder 16A and 16B to the traces 18A and 18B, respectively. The solder utilized in the solder reflow process is retained in a desired area by solder mask 12. Due to the nature of the solder reflow process, a flux/oxide solution 22 is formed between the end terminals 14A and 14B of the component 14 and between the substrate 10. As is further discussed below, the flux/oxide solution 22 allows for relatively high leakage currents between the end terminals 14A and 14B, which is undesirable.

Figure 2:
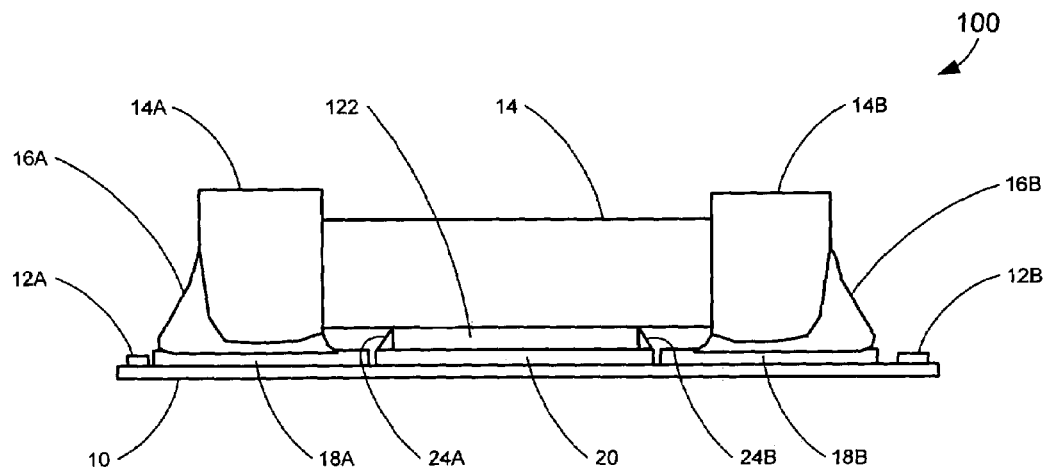
FIG. 2 is a cross-sectional view of a relevant portion of an exemplary electronic assembly, configured according to one embodiment of the present invention.

With reference to FIG. 2, a cross-sectional view of an exemplary electronic assembly 100, configured according to one embodiment of the present invention, is depicted. The main difference between the assembly 100 and the assembly 50 (FIG. 1) is that flux dams 24A and 24B are utilized to prevent the flux/oxide solution 122 from bridging the end terminals 14A and 14B. In this manner, the flux dams 24A and 24B interrupt a current leakage path and, thus, prevent current leakage between the end terminals 14A and 14B.

Figure 3:
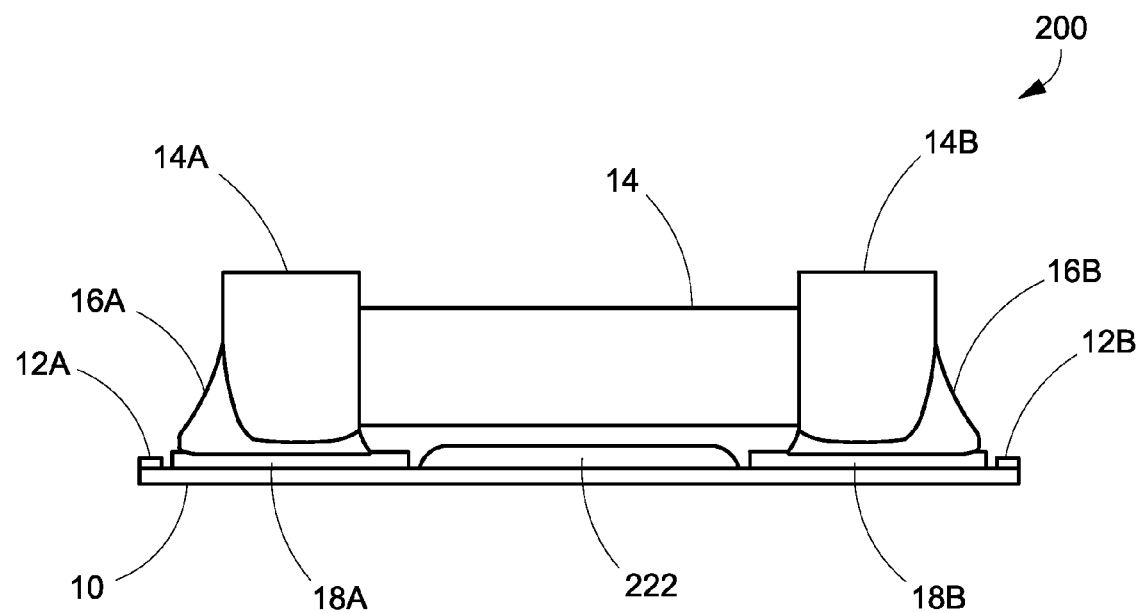
FIG. 3 is a cross-sectional view of a relevant portion of an exemplary electronic assembly, configured according to another embodiment of the present invention.

With reference to FIG. 3, a partial cross-sectional view of an exemplary electronic assembly 200, constructed according to another embodiment of the present invention, is shown. As is shown, the ground plane 20 that was utilized in assemblies 50 and 100 (FIGS. 1 and 2, respectively) has been removed. As such, the flux residue 222 is not in contact with the component body of the SMT electronic component 14. Thus, a leakage current path does not exist between the end terminals 14A and 14B of the SMT electronic component 14.

Figure 4:
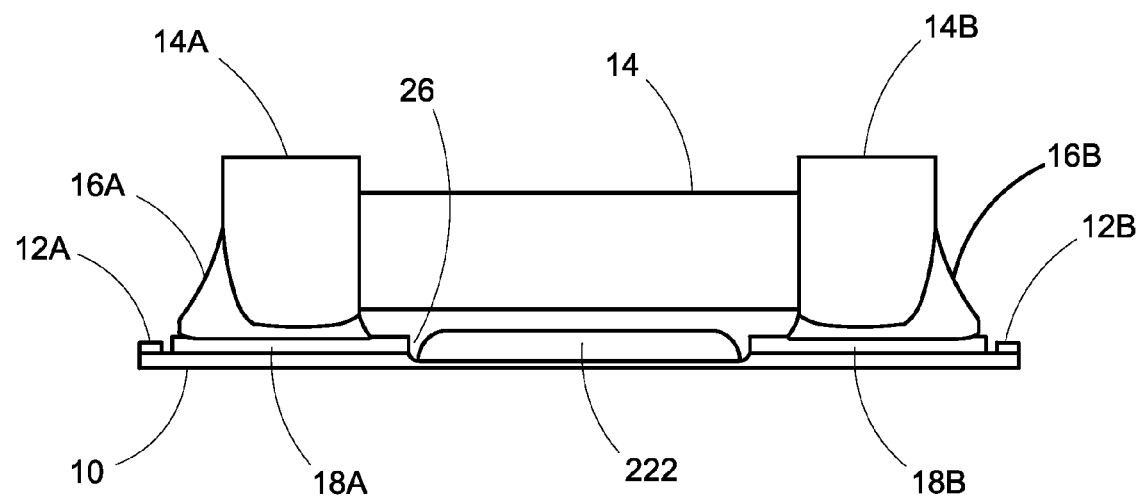
FIG. 4 is a cross-sectional view of a relevant portion of an exemplary electronic assembly, configured according to another embodiment of the present invention.

It should be appreciated that increasing the distance between the substrate 10 and the component 14 may be accomplished in a number of ways. For example, instead of removing the ground plane 20 that is underneath the SMT electronic component 14, one could utilize traces 18A and 18B of greater height. However, it should be appreciated that increasing the height of the traces 18A and 18B would result in an additional expense. Additionally, if desired, with reference to FIG. 4, the substrate 10 could be grooved 26 in locations where SMT components are to be placed. Thus, the substrate 10 is configured to include a portion of the substrate 10 defining a groove 26 between the first and second conductive traces 18A, 18B that is aligned with the electronic component 14 to increase a distance between the substrate 10 and the component 14 body and to capture excess flux.

Accordingly, electronic assemblies have been described herein that include a substrate that is configured to prevent flux residue from providing a leakage current path. This is particularly advantageous in the automotive environment, where electronic assemblies are frequently required to operate at higher temperatures and under increasingly harsh environmental conditions.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An electronic assembly, comprising:
    a substrate including a first side and a second side opposite the first side, wherein at least the first side of the substrate includes a plurality of conductive traces formed thereon, and wherein the plurality of conductive traces includes a first conductive trace and a second conductive trace;
    at least one surface mounted electronic component electrically coupled between the first and second conductive traces, wherein a component body of the electronic component is subject to interaction with a flux, that is utilized during electrical coupling of the electronic component to the first and second conductive traces, to form a current leakage path, and wherein the substrate is configured to prevent the formation of the current leakage path wherein the substrate configuration comprises a portion of the substrate defining a groove between the first and second conductive traces that is aligned with the electronic component to increase a distance between the substrate and the component body and to capture excess flux.

2. The assembly of claim 1, wherein a ground plane located on the first side of the substrate is configured to be substantially absent under the component body of the electronic component to increase a distance between the substrate and the component body and reduce an actual leakage current associated with the electronic component.

3. The assembly of claim 1, wherein the electronic component is a varistor.

4. The assembly of claim 1, wherein the component body includes an oxide that is subject to migration into the flux when the flux is in contact with the component body, and wherein an actual leakage current is at least partially attributable to the migration of the oxide into the flux when the flux is in contact with the component body.

5. The assembly of claim 4, wherein the oxide is a zinc oxide.

6. The assembly of claim 1, wherein the component body of the electronic component does not include an outer glass passivation layer.

7. The assembly of claim 1, wherein the substrate is a printed circuit board (PCB).

8. The assembly of claim 1, wherein the substrate configuration comprises at least one flux dam applied to the substrate to block the flux from flowing between the first and second electrical traces.

9. An electronic assembly, comprising:
    a substrate including a first side and a second side opposite the first side, wherein at least the first side of the substrate includes a plurality of conductive traces formed thereon, and wherein the plurality of conductive traces includes a first conductive trace and a second conductive trace;

at least one surface mounted electronic component electrically coupled between the first and second conductive traces, wherein a component body of the electronic component is subject to interaction with a flux, that is utilized during electrical coupling of the electronic component to the first and second conductive traces, to form a current leakage path, and wherein the substrate is configured to prevent the flux from contacting the component body to reduce an actual leakage current associated with the electronic component, where the component body of the electronic component does not include an outer glass passivation layer wherein the substrate configuration comprises a portion of the substrate defining a groove between the first and second conductive traces that is aligned with the electronic component to increase a distance between the substrate and the component body and to capture excess flux.

10. The assembly of claim 9, wherein a ground plane located on the first side of the substrate is configured to be substantially absent under the component body of the electronic component to increase a distance between the substrate and the component body and reduce an actual leakage current associated with the electronic component.

11. The assembly of claim 9, wherein the electronic component is a varistor.

12. The assembly of claim 9, wherein the component body includes an oxide that is subject to migration into the flux when the flux is in contact with the component body, and wherein the actual leakage current is at least partially attributable to the migration of the oxide into the flux when the flux is in contact with the component body.

13. The assembly of claim 12, wherein the oxide is a zinc oxide.

14. The assembly of claim 9, wherein a flux blocking material is placed on the substrate to block the flow of flux between the first and second electrical traces.

15. The assembly of claim 14, wherein the flux blocking material is one of an adhesive and an ink.

16. The assembly of claim 9, wherein the substrate is a printed circuit board (PCB).

17. An electronic assembly, comprising:
a substrate including a first side and a second side opposite the first side, wherein at least the first side of the substrate includes a plurality of conductive traces formed thereon, and wherein the plurality of conductive traces includes a first conductive trace and a second conductive trace;

at least one surface mounted electronic component electrically coupled between the first and second conductive traces, wherein a component body of the electronic component is subject to interaction with a flux, that is utilized during electrical coupling of the electronic component to the first and second conductive traces, to form a current leakage path, and wherein the substrate is configured to prevent the flux from contacting the component body to reduce an actual leakage current associated with the electronic component, where the electronic component is a varistor wherein the substrate configuration comprises a portion of the substrate defining a groove between the first and second conductive traces that is aligned with the electronic component to increase a distance between the substrate and the component body and to capture excess flux.

18. The assembly of claim 17, wherein a ground plane located on the first side of the substrate is configured to be substantially absent under the component body of the electronic component to increase a distance between the substrate and the component body and reduce an actual leakage current associated with the electronic component.

19. The assembly of claim 17, wherein the component body includes an oxide that is subject to migration into the flux when the flux is in contact with the component body, and wherein the actual leakage current is at least partially attributable to the migration of the oxide into the flux when the flux is in contact with the component body.

20. The assembly of claim 19, wherein the oxide is a zinc oxide.

21. The assembly of claim 19, wherein the component body of the electronic component does not include an outer glass passivation layer.

22. The assembly of claim 19, wherein the substrate is a printed circuit board (PCB).

* * * * *